United States Patent
Thirani et al.

(10) Patent No.: US 11,307,117 B2
(45) Date of Patent: Apr. 19, 2022

(54) SYSTEM AND METHOD FOR INTERPRETATION AND ANALYSIS OF MANUFACTURING ACTIVITY

(71) Applicant: Amper Technologies, Inc., Chicago, IL (US)

(72) Inventors: Akshat Thirani, Chicago, IL (US); Philip House, Cleveland Height, OH (US)

(73) Assignee: Amper Technologies, Inc., Chicago, IL (US)

( * ) Notice: Subject to any disclaimer, the term of this patent is extended or adjusted under 35 U.S.C. 154(b) by 578 days.

(21) Appl. No.: 16/121,417

(22) Filed: Sep. 4, 2018

(65) Prior Publication Data
US 2019/0072461 A1    Mar. 7, 2019

Related U.S. Application Data

(60) Provisional application No. 62/554,012, filed on Sep. 4, 2017.

(51) Int. Cl.
| | |
|---|---|
| *G01M 99/00* | (2011.01) |
| *G05B 23/02* | (2006.01) |
| *G07C 3/00* | (2006.01) |
| *G06Q 10/00* | (2012.01) |
| *G05B 19/406* | (2006.01) |
| *G01R 19/25* | (2006.01) |
| *G01R 21/133* | (2006.01) |

(52) U.S. Cl.
CPC ......... *G01M 99/005* (2013.01); *G05B 23/024* (2013.01); *G05B 23/0283* (2013.01); *G06Q 10/20* (2013.01); *G07C 3/00* (2013.01); *G01R 19/25* (2013.01); *G01R 21/133* (2013.01); *G05B 19/406* (2013.01); *G05B 2219/34427* (2013.01)

(58) Field of Classification Search
None
See application file for complete search history.

(56) References Cited

U.S. PATENT DOCUMENTS

| | | | |
|---|---|---|---|
| 6,636,842 B1 * | 10/2003 | Zambrano | G05B 23/024 |
| | | | 706/23 |
| 10,514,399 B1 * | 12/2019 | Orofino, II | G01R 15/207 |

(Continued)

FOREIGN PATENT DOCUMENTS

WO    WO-2008145859 A2 *  12/2008  .............. G06M 9/00

OTHER PUBLICATIONS

WO 2008145859 A2—translation (Year: 2008).*

*Primary Examiner* — Lina M Cordero
(74) *Attorney, Agent, or Firm* — Alpine Patents LLC; Brian Van Osdol

(57) ABSTRACT

A system and method for monitoring manufacturing machines that includes a sensor system that monitors a plurality of machines, wherein the sensor system is comprised of a set of current transformers, and wherein the set of current transformers transform electric currents to the plurality of machines into electric signals; an activity processing engine, wherein the activity processing engine generates diagnostic metrics from the electric signals for each machine from the plurality of machines; and a management platform configured to provide access to diagnostic metrics of the plurality of machines.

20 Claims, 8 Drawing Sheets

(56) References Cited

U.S. PATENT DOCUMENTS

| | | | |
|---|---|---|---|
| 2007/0282545 A1* | 12/2007 | Board | G01H 1/00 |
| | | | 702/56 |
| 2011/0066391 A1* | 3/2011 | AbuAli | G06Q 10/06 |
| | | | 702/61 |
| 2012/0323510 A1* | 12/2012 | Bell | H04M 19/08 |
| | | | 702/62 |
| 2015/0233984 A1* | 8/2015 | Choe | H02J 7/0047 |
| | | | 702/60 |
| 2016/0212506 A1* | 7/2016 | Norwood | H02J 13/0006 |
| 2016/0274552 A1* | 9/2016 | Strohmenger | G06Q 10/06 |
| 2016/0349293 A1* | 12/2016 | Chattopadhyay | G01R 19/0092 |
| 2018/0165384 A1* | 6/2018 | Gandhi | G05B 23/0254 |
| 2020/0012270 A1* | 1/2020 | Hollender | G05B 23/024 |

* cited by examiner

Electrically coupling a set of electric current sensors to a set of powerlines, wherein each powerline is connected to one of a plurality of machines S111

Collecting machine activity data from a set of sources associated with the plurality of machines S121

For each source of machine activity data:

Selecting an analysis model S131

Analyzing the machine activity data S130

Providing an analysis interface that exposes access to diagnostic metrics across at least a subset of the plurality of machines S140

FIGURE 5

SYSTEM AND METHOD FOR INTERPRETATION AND ANALYSIS OF MANUFACTURING ACTIVITY

CROSS-REFERENCE TO RELATED APPLICATIONS

This application is related to U.S. patent application Ser. No. 62/554,012, filed on 4 Sep. 2017, which is incorporated in its entirety by this reference.

TECHNICAL FIELD

This invention relates generally to the field of manufacturing management, and more specifically to a new and useful system and method for monitoring manufacturing machines using electrical signals.

BACKGROUND

Manufacturing any product is a complex operation that depends on many factors. However, there are few options in the field of manufacturing to enable a data-based understanding of the manufacturing process. Modern equipment sometimes comes with data integration capabilities. However, this is limited to only a subset of new machines. Even those that do have data integration often go unused because of the amount of work to enable the data integration. Furthermore, many manufacturing machines have a long lifetime and therefore are infrequently replaced by new equipment. As a result, many manufacturing operations have many pieces of older equipment that likely won't be replaced by machines with data-integration capabilities for many years if not decades. Thus, there is a need in the manufacturing management field to create a new and useful system and method for interpretation and analysis of manufacturing activity. This invention provides such a new and useful system and method.

BRIEF DESCRIPTION OF THE FIGURES

FIG. 5 is a flowchart representation of a variation of a method of a preferred embodiment.

DESCRIPTION OF THE EMBODIMENTS

Figure 1:
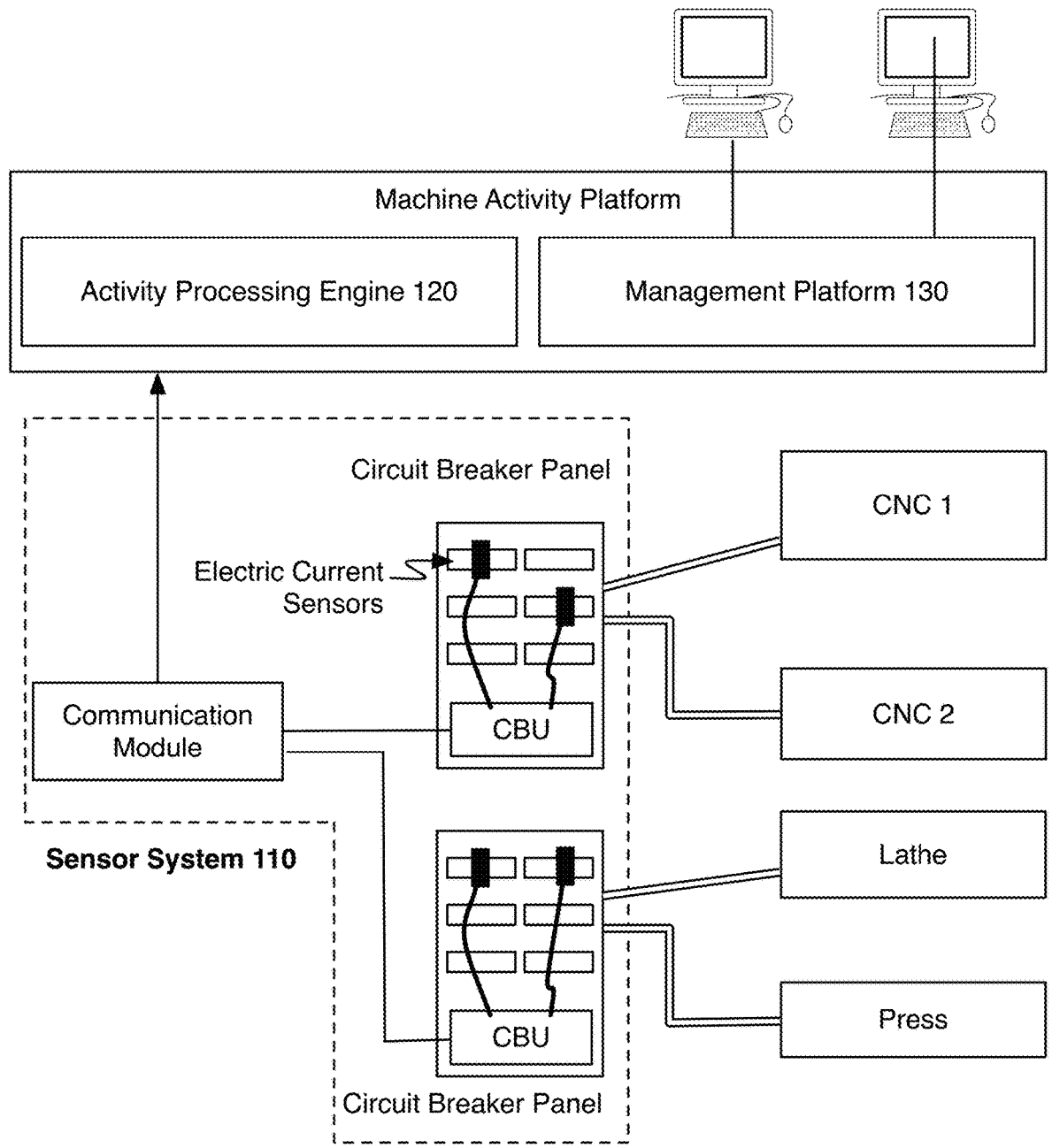
FIG. 1 is a schematic representation of a system of a preferred embodiment.

The following description of the embodiments of the invention is not intended to limit the invention to these embodiments but rather to enable a person skilled in the art to make and use this invention.

1. Overview

A system and method for manufacturing activity interpretation functions to enable machine activity signals generated through operation of multiple manufacturing machines to be transformed into data regarding manufacturing machine operation and into performance metrics. The system and method have particular utility to manufacturing environments where the multiple manufacturing machines may be of different types and models. The system and method can additionally assist where different subsets of machines in a monitored environment are performing the same and/or different operations. Accordingly, the system and method can provide an approach for gaining metric insights into the operation and status across a manufacturing floor or any manufacturing setting. In particular, the system and method leverage the sensing of electric power (current) into electric signals of a machine and the transformation of those electric signals into machine metrics. As a result, the analog power signal for a machine on a factory floor can be translated into operational decisions and predictions.

The system and method can be applied to production planning, to maintenance decisions, to responding to real-time changes in production, and to other tasks. The system and method can be applied in helping plant managers, machine operators, and other entities involved in the manufacturing process to improve and understand machine, labor, and process.

In leveraging electrical current sensing, the system and method can enable simple and non-invasive installation with a machine with minimal or no downtime. The system and method can enable key machine metrics like machine utilization, downtime, cycle time, unit production count, energy usage, machine/tooling maintenance assessment, detection of manufacturing process changes/anomalies, and/or other metrics.

The system and method are preferably applied in the areas of manufacturing. Manufacturers can install multiple instances of the system and method on the various machines to track manufacturing metrics of each machine. Instances of the system and method may be used by small, medium, large, or any suitable size of manufacturer. Machines such as CNC machines, mills, lathes, band saws, injection molding machines, conveyor belts, stamping presses, PCB assembly machines, laser cutters, and/or any suitable manufacturing machines may be compatible for use with the system and method.

As one potential benefit, the system and method offer a simple, non-invasive form of data-integration. By providing machine metrics extracted from the electrical power signal, the system and method can be integrated easily at the circuit breaker site. Machines can have minimal downtime and do not rely on costly IT integrations. In some instances, a full factory can be integrated with the system and method in a matter of minutes or hours.

As another potential benefit, the system and method is highly versatile and can be used with a wide range of types of machines. Old legacy machines as well as modern machines can similarly be used with the system and method. Many sites will have a variety of machines of different types and different versions. The system and method can be used even with machines that have no smart reporting or advanced analytic capabilities. Furthermore, the system and method may be usable with custom machines. In being highly versatile, the system and method can be more fully integrated with the full manufacturing process of a wider variety of manufacturing operations. Even basic elements of the manufacturing process like a conveyor belt could be integrated.

As another potential benefit, the system and method can provide a rich-level of machine insights. Machine usage, cycle time, downtime, tool utilization, machining imbalances, part production count, and/or other machine metrics are examples of potential machine metrics and insights that may be exposed through the system and method. Such insights can further be broken down by machine, manufacturing stage, part, unit, or any suitable partition of the manufacturing process.

As another potential benefit, the system and method may be used in providing predictive maintenance and/or enhanced operation of a machine. The system and method can facilitate planned maintenance of machines based on usage and performance of a machine. For example, tool degradation and/or machine calibration can be tracked through the system and method and used to alert workers of upcoming maintenance tasks. Similarly, the system and method may be able to interpret aspects of manufacturing process to characterize efficiency for processing of a particular part. For example, the system and method could identify portions of a milling process with elevated machine stress.

As another potential benefit, the system and method may allow for an efficient method of monitoring without having to implement digital logic controllers. Digital logic controllers may require a significant overhead cost of data integration. The massive amount of data gathered may lead to inefficient system monitoring and to a large cost of data processing and storage. The system and method may allow avoidance of gathering and computing such large amounts of data and instead focus on collecting a minimal amount of machine information that still can be processed into important manufacturing metrics for end users of this information.

As another potential benefit, the system and method may allow a cost-effective method of monitoring different machine types without the necessity of developing proprietary software. Although many manufacturing machines have their own built in monitoring systems, distinct machine types may not have the compatibility to implement the same diagnostic systems and/or software. This system and method may allow for monitoring a plurality of these machines without having to develop a new monitoring system.

2. System

As shown in FIG. 1, a system for managing machines of a preferred embodiment comprising of: a sensor system 110, that monitors a plurality of machines; an activity processing engine 120; and a management platform 130. The system functions to monitor and manage the plurality of machines that may be of distinct types, models, versions, ages, configurations, functionalities, and/or purposes. The sensor system 110 may include a set of current transformers that measure the electric current draw by each machine from the plurality of machines into electric signals and time-series data of the electrical signatures. The activity processing engine 120 may then convert the electric signals into key diagnostic metrics of the system that are then managed and reported through the management platform 130. The system preferably leverages non-invasive monitoring of the machines, which in a preferred variation includes electrical coupling with the power supply of the machines (e.g., at the circuit breaker). From this an electrical signal is gathered for machines and analyzed for detecting a variety of diagnostic metrics of the machine, manufacturing process, and/or factory.

In one preferred implementation, the sensor system 110 includes at least one electric current sensor, a circuit breaker unit, and integration with an activity processing engine 120 through a communication module, as shown in FIG. 1. The electric current sensors in this implementation are preferably current transformers, and the current transformers preferably electrically couple to power lines of a connected machine at a breaker box. The communication module communicatively couples to the breaker box unit, and the communication module is preferably configured to communicate the electric signals to the activity processing engine. Such a variation is particularly applicable for integration with circuit breaker panels used as the power outlets for manufacturing machines.

An instantiation of the system can preferably be installed and configured for any suitable manufacturing environment. Herein, an instantiation of the system is used to describe the use of the system in a particular manufacturing environment. In some cases, there may be only a small number of machines that are monitored (e.g., a small manufacturing shop with 2-10 machines). In other instantiations, a large number of machines can be monitored across multiple areas of a manufacturing plant (e.g., 10's-100's of machines). The system may additionally be configured to work across multiple manufacturing environments such that a very large manufacturer can gain manufacturing insights across multiple locations.

Additionally, the system may operate as a multitenant system wherein, the management platform 130 supports multiple accounts to access machine/manufacturing insights for their assigned instantiations. The cloud infrastructure to support manufacturing activity analysis is preferably shared across users of the system. For example, manufacturer X may use the system to monitor manufacturing activity of factory X, while manufacture Y may use the system to monitor manufacturing activity of factory Y1 and Y2.

Figure 2:
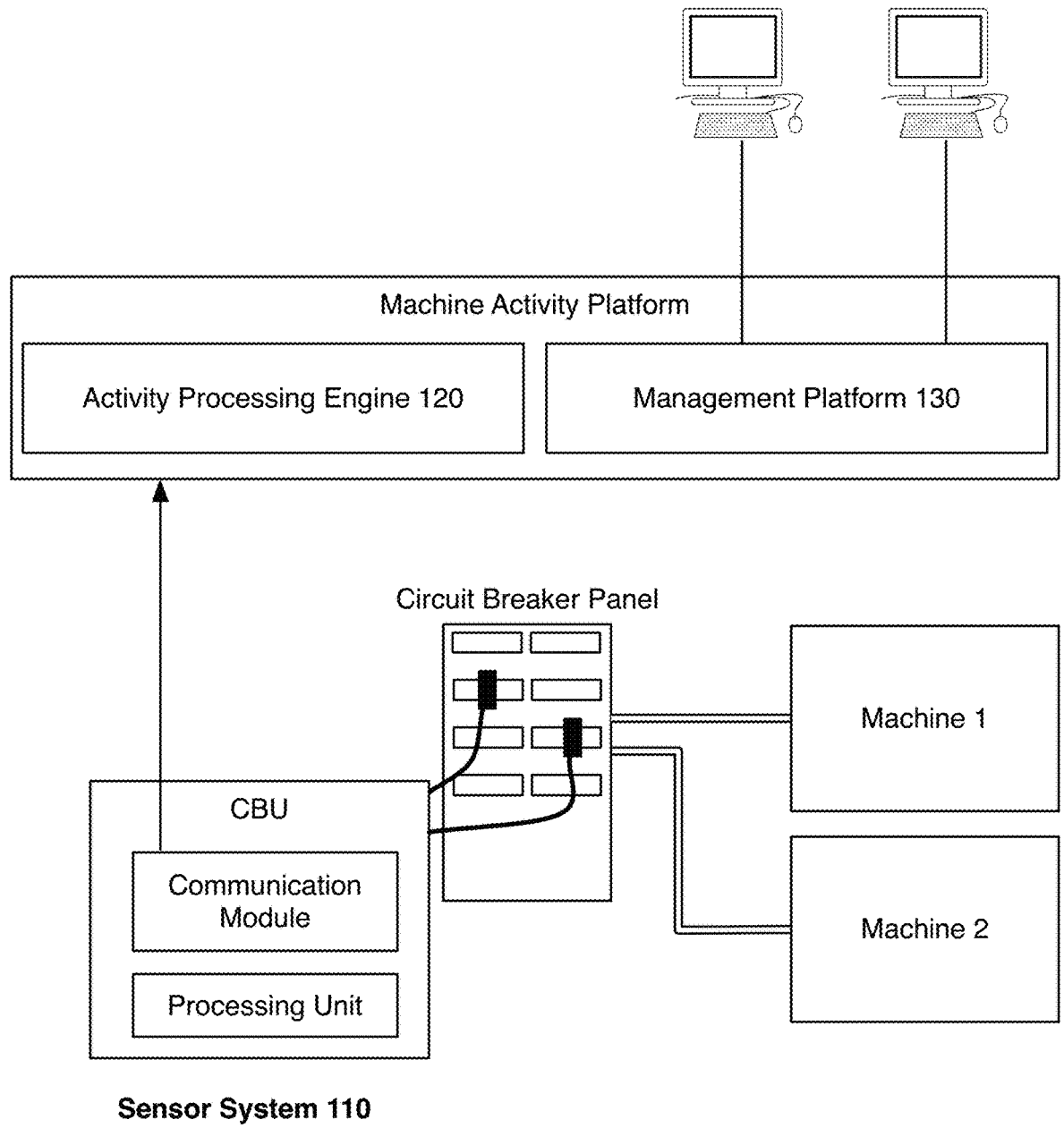
FIG. 2 is an alternate schematic representation of a system of preferred embodiment.

The sensor system 110 of a preferred embodiment functions to collect machine operation data from the plurality of machines. The sensor system 110 may sense or detect signals that are generated during machine operation. Preferably machine operation data is collected as a time series. Preferably, the sensor system 110 may detect and measure the electric current to each machine from the plurality of machines, wherein the electric current is a signal generated during machine operation. Additionally or alternatively, the sensor system 110 may measure other generated signals during machine operation. Other additional operating signals may include, but are not limited to: vibration, heat, movement, sounds, and/or any other machine operational data that may be of interest. In some preferred variations, as seen in FIGS. 1 and 2, the sensor system 110 monitors the electric current to the plurality of machines through at least one circuit breaker panel. In some instances, the sensor system 110 monitors a plurality of circuit breaker panels within an environment. As described below, the sensor system 110 preferably includes a set of current transformers. The sensor system 110 may alternatively or additionally monitor electric current to the plurality of machines through other methods, such as: connecting directly to the power supply of each machine of the plurality of machines.

The plurality of machines monitored by the sensor system 110 may comprise of a single machine, but will preferably include multiple machines. This plurality of machines may include subsets of machines of different type, function, and/or age. For example, within a particular factory or for a particular account, the distinct type of machines could include mills, lathes, drill presses, injection molding machines, CNCs, presses, extrusion machines, robotic devices, metal fabrication equipment, semiconductor/electronic fabrication equipment, conveyor belts or material manipulation tools, and/or other manufacturing machines. Similarly, a single factory may have two or more subsets of machines of the same type but of different models. Additionally, machines may be performing different tasks (for different projects or the same project). Additionally, over the time of operation of the system, the plurality of machines may increase in number, decrease in number, and/or change in type. In some variations, multiple sensor systems 110, each monitoring a distinct plurality of machines may be combined into a single system. Alternatively, multiple systems may be monitored and managed simultaneously as a both a single system and as distinct systems or in some combination.

The sensor system 110 preferably includes a set of electric signal sensors and more preferably a set of electric current sensors used to measure current of the machines. In some variations, the electric current sensors are current transformers. The set of current transformers function to transform the electric current to each machine, from the plurality of machines, to an electric signal—measuring the electric current draw by each monitored machine. A current transformer in one variation can be a split core current transformer that can be electrically coupled to a power line of a machine. The current transformer preferably includes a defined throughchannel cavity such that the current transformer can attach around a power line and thereby measure an electric signal related to the current delivered to the machine.

Multiple electric current sensors are preferably used to measure different machines. In a preferred variation, multiple electric current sensors are connected to and read by a local collector unit. The local collector unit functions as a system component for managing the integration of one or more sensors with the rest of the system. The local collector unit can collect raw electric signals, process the electric signals, and relay electrical signal data to other components of the system. In a preferred variation, the local collector unit is used to collect electrical signals from multiple machines at the circuit breaker boxes of a manufacturing site. Accordingly, in one preferred variation, a local collector unit is a circuit breaker unit, which functions to manage the integration of one or more sensors monitoring one or more circuit breaker with the rest of the system.

In preferred variations, where the electric current sensors are coupled to machines through a circuit breaker panel, the electric current sensors preferably connect to a circuit breaker box unit. Integrating with a circuit breaker panel is a preferred approach, but the electric current sensors may alternatively be electrically coupled to the plurality of machines at alternative locations such as directly at a machines power cable. For many machines, the machines are powered through a three-phase power source and couple to the power source through a three-phase circuit breaker. In one implementation, only a single phase is monitored but multiple phases could similarly be monitored. For example, a current transformer used to monitor a machine may be coupled to a single phase of the machine. Alternatively, a machine may be monitored by having multiple current transformers coupled to multiple phases of a power source. The circuit breaker unit functions as a system component for managing the integration of one or more sensors with the rest of the system. Since the machine monitoring system may be used in monitoring a plurality of machines within a circuit breaker panel, multiple electric current sensors can be connected to a circuit breaker unit. The circuit breaker unit can be configured for collecting and compiling the raw electrical activity data from the electric current sensors.

As each electric current sensor collects electrical signals of one machine, each electric current sensor may be configured within the system such that the identity of a machine is associated with or otherwise mapped to an identifier of the particular electric current sensor. Additionally, during configuration of an instantiation of the system.

The circuit breaker unit is preferably installed within circuit breaker panel and is used in simplifying the system installation. Circuit breaker panels generally lack power outlets for powering a device and wireless communication signals can be weakened because of the encasing of the panel box. Accordingly, the circuit breaker unit can act as an intermediary relay to simplify the powering and data communication to the communication module. The circuit breaker unit preferably connects to a communication module through a CAT-5 cable that is used in supplying power and acting as a communication channel. Alternatively, any suitable power and data connections may be used. In one variation, circuit breaker units can be communicatively coupled such that multiple circuit breaker units can be connected as a network. For example, a series of circuit breaker units can be connected in a series.

The sensor system 110 may additionally include a set of processor units and at least one communication module.

The set of processor units may function to process the electric signals. A processing unit can facilitate local processing of the collected data. Local processing can transform the data for more efficient communication of the signal data, for performing initial processing that depends on higher resolution of data, and/or for other purposes. In some preferred implementations, the processing unit is an aggregator. In some variations, more in depth analysis may additionally be performed at the processor units. Alternatively, the system may perform no local processing and communicate raw sensor data to the activity processing engine. The processor units may be a standalone component in communication with the collector units and the communication module, be part of the collector units, be part of the communication module, and/or integrated into any suitable system component.

The communication module functions as a gateway for communication to a remote machine analysis platform containing the activity processing engine 120 and/or management platform 130. The communication gateway preferably acts as a gateway to the main processing of the platform, and is configured to communicate time series data. The communication module may additionally include one or more local data processing units, for increased data efficiency or for higher resolution analysis. The communication module can include Wi-Fi, cellular, Bluetooth, Ethernet, and/or other communication capabilities for relaying the electrical signal data. A communication module may connect to one or more circuit breaker units. Preferably, the communication module is a distinct system from the circuit breaker units. For example, the circuit breaker units may in some instances be housed inside a circuit breaker box, and the communication module can be housed external to a circuit breaker box, which functions to have remote communication avoid interference of the circuit breaker box. Alternative variations may have the communication module integrated with the controller unit (e.g., circuit breaker unit) as shown in FIG. 2. A factory may contain multiple installed communication modules. In one variation, the set of communication modules can establish a mesh-network to consolidate communication and coordination with remote processing systems.

In some alternative variations, the sensor system 110 can include other sensor inputs that can provide additional machine activity data. Machine activity data can include any suitable data signal that relates back to state and/or activity of a machine. Additional sensors may include vibrational sensors, auditory sensors, image sensors, and/or other suitable sensors. As another potential input, the sensor system 110 may additionally collect machine data output, which may be communicated data using a suitable data communication protocol. These additional data inputs can be collected by shared collector units or have dedicated collector units that collect data and similarly communicate the data to an activity processing engine.

The activity processing engine 120 of a preferred embodiment functions to convert machine activity data it receives into key diagnostic metrics of the system. The activity processing engine generates key diagnostic metrics from the set of activity data sources such as the electric signals measured for each of the plurality of machines. Preferably, the machine activity data received by the activity processing engine 120 is in the form of electric signals from the sensor system 110, but may be machine activity data from additional or alternative sources, such as: machine warnings, alarms, light signals, vibrations, sound, or any other type of useful machine activity data. Each source is preferably associated with a particular machine. However, some variations may have a single source correspond to multiple machines. Analysis can be broken down by machine, by machine type, by part type, by individual part, by multi-stage manufacturing process type, across the manufacturing site, and/or across any suitable segment. In some variations, the activity processing engine 120 includes machine readable configuration to automatically classify, segment, and/or otherwise label the machine activity data. Automatic labeling can be used to detect similar processes performed across machines of the same type (e.g., detecting the same part manufacturing process performed on different machines). The activity processing engine 120 preferably has multiple analysis processes that are run on the machine activity data. Such analysis model can include those for generating diagnostic metrics such as: machine utilization, machine down time, machine idle time, cycle time, part/process identification, part/process counting, part processing analysis, part/process change, machine/tooling degradation or maintenance status, power usage, material consumption, machine efficiency, and/or other suitable metrics.

Preferably key diagnostic metrics generated by the activity processing engine 120 for the machine activity include: the machine state, the machine cycle time, the number of parts produced, and the machine power consumption. Additional key diagnostic metrics may be added or removed as desired.

The machine state preferably classifies or otherwise characterizes the status of the machine. In one preferred variation, the set of machine states identified for a machine can identify whether a machine is in production, off, or idle. In other words, a set of potential machine states can include an on-state, an off-state, and an idle-state. Additional and/or alternative machine states may be identified as seen applicable. Examples of additional machine states include: a calibration state, a "warm up" state when the machine is turned on but not ready to function yet, an "overclocked" state where the machine is set to function above normal production speed parameters, an "out of raw material" state, a not available state, a function error state, an "out of order" state, a maintenance state, and/or any suitable type of machine state. The machine activity data and more specifically the electric current signal can preferably be classified according to the set of detectable states. In one implementation, the various states of a machine are labeled and used in training a machine learning model, which can then be applied for similar types of machines so as to generate appropriate machine state classifiers.

The machine cycle time may measure the amount of time it requires for a machine to produce a single unit (or a single subunit) of good, and/or the time it requires for the machine to go through a single operation cycle. For machines that produce multiple goods and/or have multiple types of operation cycles, the activity processing engine 120 preferably measures the cycle time and identifies the "type" of cycle.

The process to identify a type of cycle preferably includes configuration to segment a cycle, detect cycle signature features, and assign a cycle identifier. In some cases, previously analyzed data may have a matching or corresponding signature and therefore would be identified with a shared cycle. A machine cycle may correspond with a particular part or process. For example, the process of milling a particular part may have a particular cycle identifier that can be detected across machines each time the part is milled. A label may be assigned to the cycle identifiers manually or automatically. As an example of a manual labeling process, a worker may supply a label to a current manufacturing process through a machine management device (described below), and that label can then be associated with the detected cycle identifier. As an example of an automatic labeling process, segments of machine activity data matching a cycle signature may be automatically labeled with an automatically generated label, wherein the label is specified using any suitable approach such as using a random ID, using machine ID, date, and/or other metadata. In some cases, a description of the process may be automatically detected such that process characteristics can be used in a generated label.

In one example, unit production count can specify approximate or specific counts of a particular part or unit operated on by a machine. Additionally or alternatively, the count of a particular event or process may be reported. To report unit production count, the activity processing engine can be configured to identify periodic electric signal patterns representative of a machine cycle and count a number of periodic electric signal patterns. Correspondingly, the management platform will preferably then be configured to express a unit production count based on the number of periodic electric signal patterns. In some variations, wherein the implemented machine has different rates of unit production (e.g., a high throughput mode), the activity processing engine 120 may additionally identify or approximate this information with the cycle time.

In one example, the machine power consumption may show how much energy the machine uses over time. Preferably, the activity processing engine 120 determines the machine consumption in conjunction with the machine state and the machine cycle time. In some variations, key diagnostic metrics like power consumption can be associated with cycle identifiers. In this way, analytics can be viewed not just by machine or time, but also by process or even part number.

In one variation, the activity processing engine may be configured to uniquely distinguish different parts through the identification of the periodic electric signal patterns. A machine may operate on a number of different parts over its lifetime. In one variation, an operator may use a device like the management device described below to label the corresponding part or project associated with a window of operation of a machine. Alternatively, the activity processing engine can facilitate automatic detection by detecting patterns in the electric signal. The patterns may be features that are expressed over sustained period of time. For example, the time for a single production cycle of a part as well as sub-cycles and/or patterns in current fluctuations may all serve as features used in a classifier model or algorithm. Part detection can additionally be used to detect identical or similar parts being performed on different machines. For example, part detection may be used to analyze machine usage by their associated parts, projects, and/or clients.

Data collection through the activity processing engine 120 can be orchestrated in a variety of approaches. In a one approach, a consistent sampling of time series data is collected and relayed. In another variation, high-resolution data sampling can be performed at different points to alternative analysis capabilities. In another approach, high-resolution data sampling can be periodically initiated and communicated to the activity processing engine 120. Alternatively, the high-resolution data sampling can be managed by a processing unit that is configured to dynamically manage sampling resolution. For example, high-resolution data sampling can be performed during a particular window of a detected manufacturing process. In one particular implementation, the sensor system 110 can include a high-resolution monitoring module that is configured to collect high-resolution data and to apply a Fourier transform on the data for outbound communication. Such analysis may be used in building a compressed data representation of motor and machine properties such as eccentricity, winding breakdown, bearing fault and the like. The activity processing engine 120 can additionally collect other machine operation related inputs such as a production schedule, machine operation data directly collected from a machine, g-code or operation instructions, machine operator input and labeling of machine operation and/or other sources of operation data. For example, one exemplary implementation may request a machine operator to enter a process label when starting a manufacturing process for a machine.

The activity processing engine 120 may use various analysis processes to determine the key diagnostic metrics. The activity processing engine 120 may implement forms of machine learning, heuristic-based analysis, statistical analysis, forms of signal processing, human aided learning, and/or other approaches to interpreting the signals. The activity processing engine 120 may implement different modes of analysis on a single machine and/or distinct machines. In one variation, a user of the system will provide configuration information that pre-selects the type of machine to be monitored by a particular machine monitoring system and this is used in determining how the activity processing engine 120 is to be processed. As different types of machines and different individual machines may have particular signal patterns, the activity processing engine 120 is preferably configured to identify appropriate analysis processing for a machine and/or adapt analysis for the machine. Similar types of machines (e.g., same class but different manufacturers or models) may have similar processes for analyzing machine activity data. A new or custom machine may trigger a different analysis model where generic processes are used for analysis, or a custom analysis model is developed and used.

Through learning, and implementation of regressions, the activity processing engine 120, may make predictions about the behavior of the system. For example, the activity processing engine 120 preferably identifies machines (of a known type) that have been added to the system and or removed by the system. In the same manner, the activity processing engine 120 may additionally identify different versions of a machine. The activity processing engine 120 may additionally predict output times, production costs, machine longevity, recommended machine maintenance times, and/or other metrics of interest that may be learned from the system.

Activity processing engine 120 may additionally be configured to analyze machine activity data to report on machine maintenance state. In particular, particular issues related to tooling or part-tuning of a machine may be detectable through the machine activity and in particular the electric current signal of a machine. In one variation, detected harmonic frequencies in the electric current signal manifesting as cyclical signal variations can be associated with out of balance motors and/or tooling. In one implementation, a Fourier analysis of the electric current signal may identify particular harmonic frequencies that correspond to a particular machine maintenance state. In one variation, this may be used to detect when maintenance is needed. Additionally, the machine maintenance state can be tracked over time and a prediction on when maintenance is recommended can be made. As another variation, tracking of machine maintenance state can be used in quantifying the impact of a particular process or part production has on a particular machine.

The management platform 130 of a preferred embodiment functions to provide an interface to the activity processing engine 110 output as shown in FIGS. 3A-3D. The management platform 130 is preferably configured to provide access to diagnostic metrics of the plurality of machines as determined by the activity processing engine 120. The management platform 130 preferably offers a web dashboard, a mobile application, and/or a native application for inspecting and accessing analysis results. A preferred implementation of the management platform 130 preferably provides at least three forms of analysis access: real-time metrics, data analysis reports, and/or notifications. Real-time metrics can provide the key diagnostic metrics (and any additional preferred metrics) overview; the current machine states, what the machines are producing and rate of operation (cycle time), and current power consumption of the machines. The data analysis reports can be a historical look at the generated activity processing engine 120 output. For example, this may be in the form of hourly, daily, or weekly summaries. The data analysis report may additionally include changes over these periods of times and fluctuations in output. The management platform 130 can enable exploration and navigation of the diagnostic metrics in a variety of ways such as by analyzing across machine types, individual machines, by part number, by client, and/or any suitable way of segmenting data.

Figure 3A:
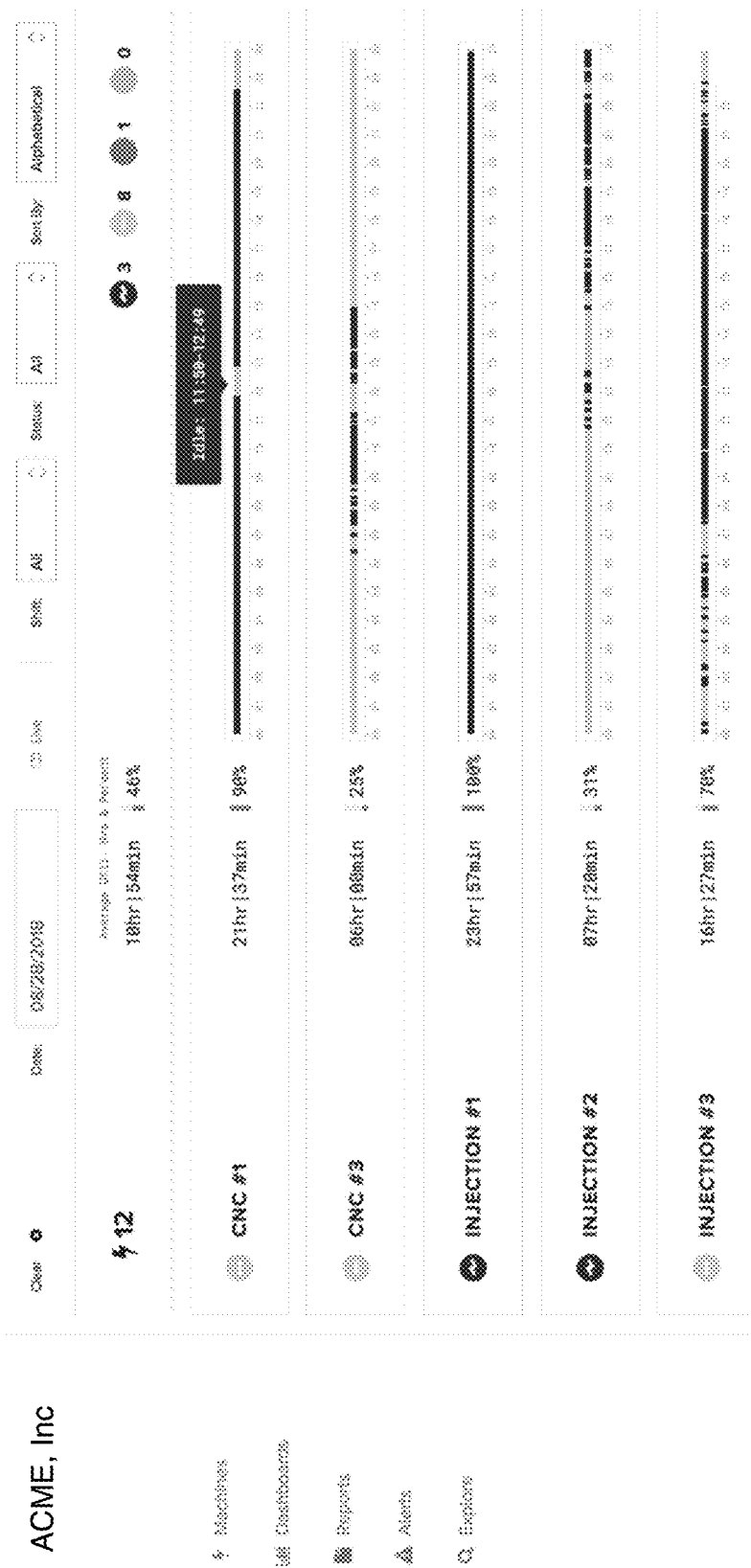
FIGS. 3A-3D are exemplary screenshots of a management dashboard.
Figure 3B:
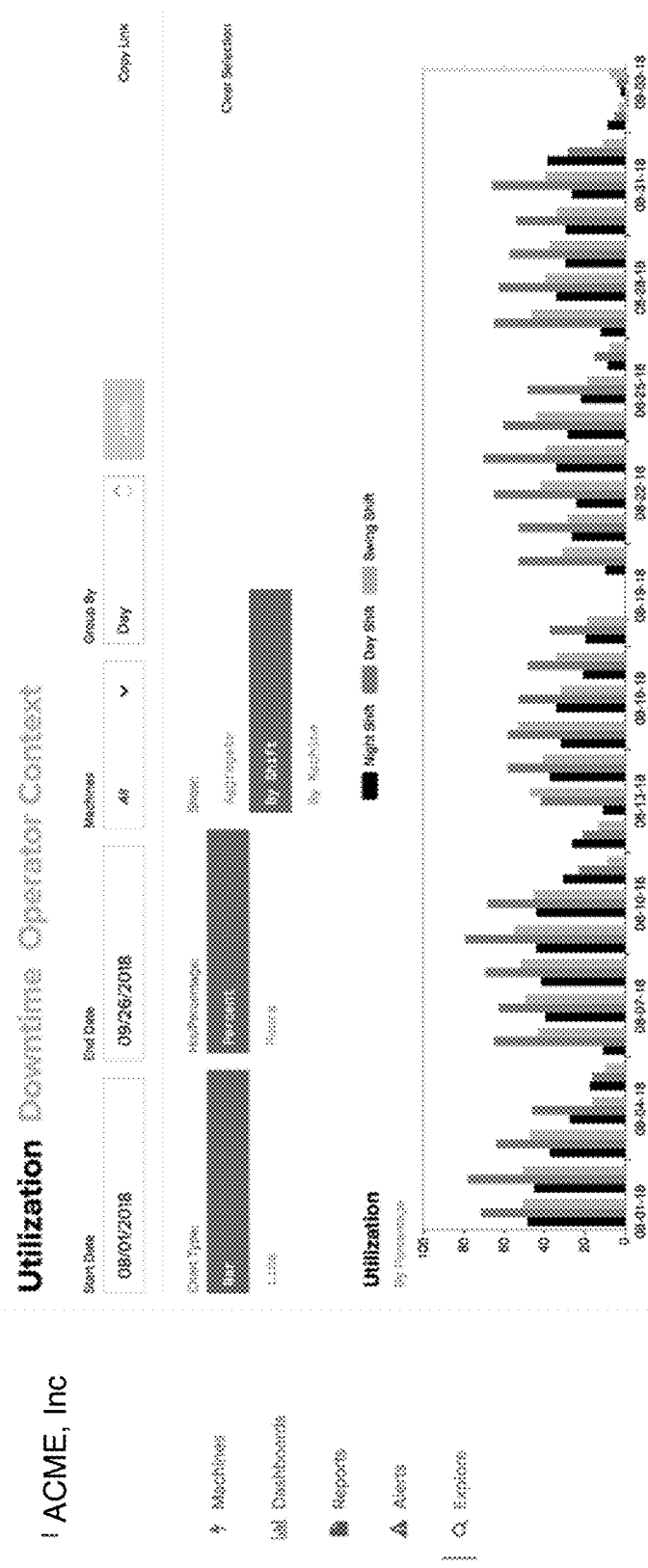
Figure 3C:
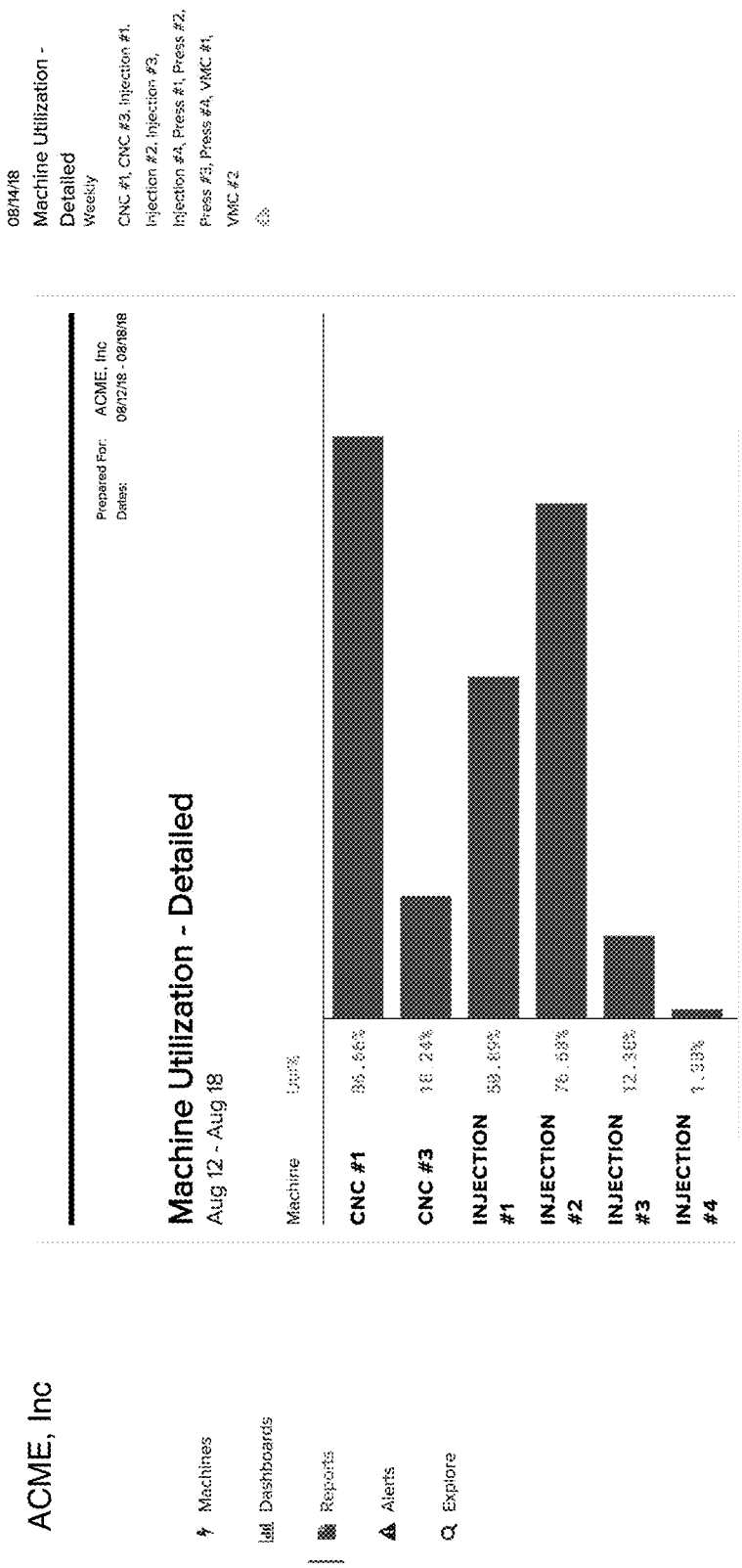
Figure 3D:
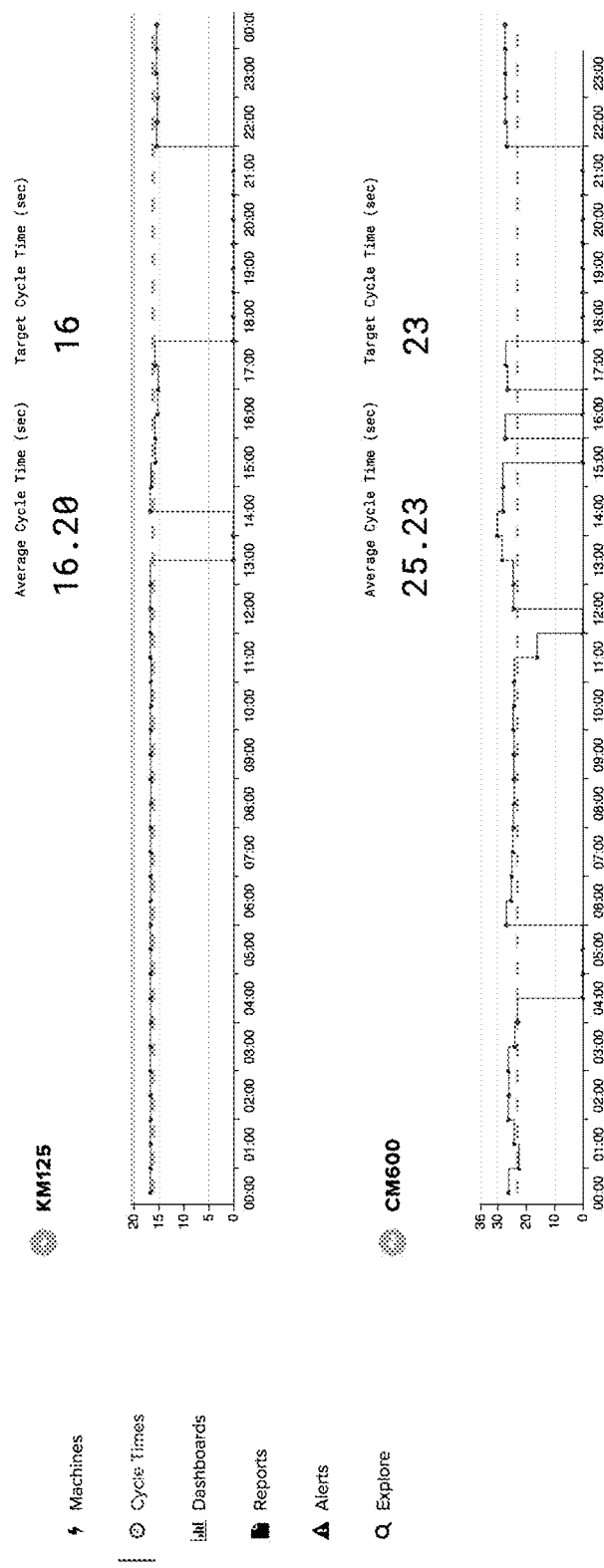

The management platform 130 may be configured to present a variety of dashboards. As shown in FIG. 3A, one exemplary dashboard can represent the utilization and the breakdown of on-state, idle-state, and other states of various monitored machines. As shown in FIG. 3B, another exemplary dashboard can enable exploring percentage of utilization of machines by different shifts (e.g., night shift, day shift, and swing shift) or other workforce breakdowns. As shown in FIG. 3C, other dashboard implementations may simplify the representation of information such as presenting a clear utilization bar graph or other infographic. As another exemplary dashboard objective, the management platform 130 can be used to present goals and actual performance relative to those goals. For example, as shown in FIG. 3D, the cycle time of various machines may be represented in comparison to target cycle times.

Notifications can be used in alerting workers or managers to particular conditions, triggering tasks, or initiating any suitable event or action. In one example, notifications may be used in notifying workers of upcoming or recommended machine maintenance. In another example, notifications may be used to notify workers that a machine, or a set of machines is not functioning properly.

The management platform 130 is preferably a cloud-hosted platform that supports multiple independent instances of the system. More particularly, the operator of the system can configure the management platform 130 such that machine analysis and monitoring can be offered as a service to users of the sensor system 110. Multiple independent manufacturing sites may integrate instances of machine sensor systems 110 that share the use of the management platform 130. A single-tenant/private implementation of the management platform 130 could alternatively be used with a single or multiple instances of sensor systems 110.

As one optional addition, the management platform 130 may include integration with machine management devices that can function as operator accessible devices. These machine management devices can be used in receiving operator feedback. The machine management devices may additionally or alternatively serve as a destination for notifications generated by the system. Machine management devices can be computers, tablets, phones, or other suitable computing device that are preferably installed near the machines or remotely accessible. Machine management devices may be designed and/or directly integrated with the management platform with the initial implementation of the system, but may additionally and/or alternatively be integrated into the system at some later time. In one example, a touch screen within a machining facility is initially integrated the machine management system and connected through a hard wire connection. In another example, a smartphone is integrated into the system, by installation of an app, and that integrates with the system through wireless technology.

The machine management devices that are integrated with the management platform 130 preferably allow user interaction. In a preferred implementation, the machine management devices can be used to collect basic information about a machine and its current contextual status. For example, a machine management device may be configured with a machine identifier such that contextual information can be associated with machine activity data collected for the corresponding machine. In one preferred implementation, an operator of a machine will select or input appropriate contextual information around the operation of a machine as they use the machine. For example, when an operator starts a machine for performing a manufacturing process, the operator can provide an associated part number or other label that is used for tracking. Additionally, the operator can specify when the machine is idling, being maintained, warming up, in active use, or in other suitable states. Operator input can be used to augment the analysis and insights provided through the management platform 130.

The machine management device may additionally be used as an output for insights, reports, notifications and/or other actions triggered by the management platform 130. For example, the user may use the machine management device to display weekly cycles by hour or day for the associated machine. Additionally, the user may explore hypothetical outcomes of the system. For example, the user may "ask" the system for the production output and the power consumption of the system if half the plurality of machines were turned off. The management platform 130, through the machine management devices may include a human assisted training function. That is, the system can enlist human analysis of signals in training analysis processes of the activity processing engine 120 and/or in helping in the automated selection of an appropriate analysis model. Signals can be segmented, and samples provided to human operators to facilitate visual selection. For example, a human operator may be asked to identify the start time and end time of the production of a certain object by a specific manufacturing machine to aid the system learn the cycle time of that machine type.

3. Method

Figure 4:
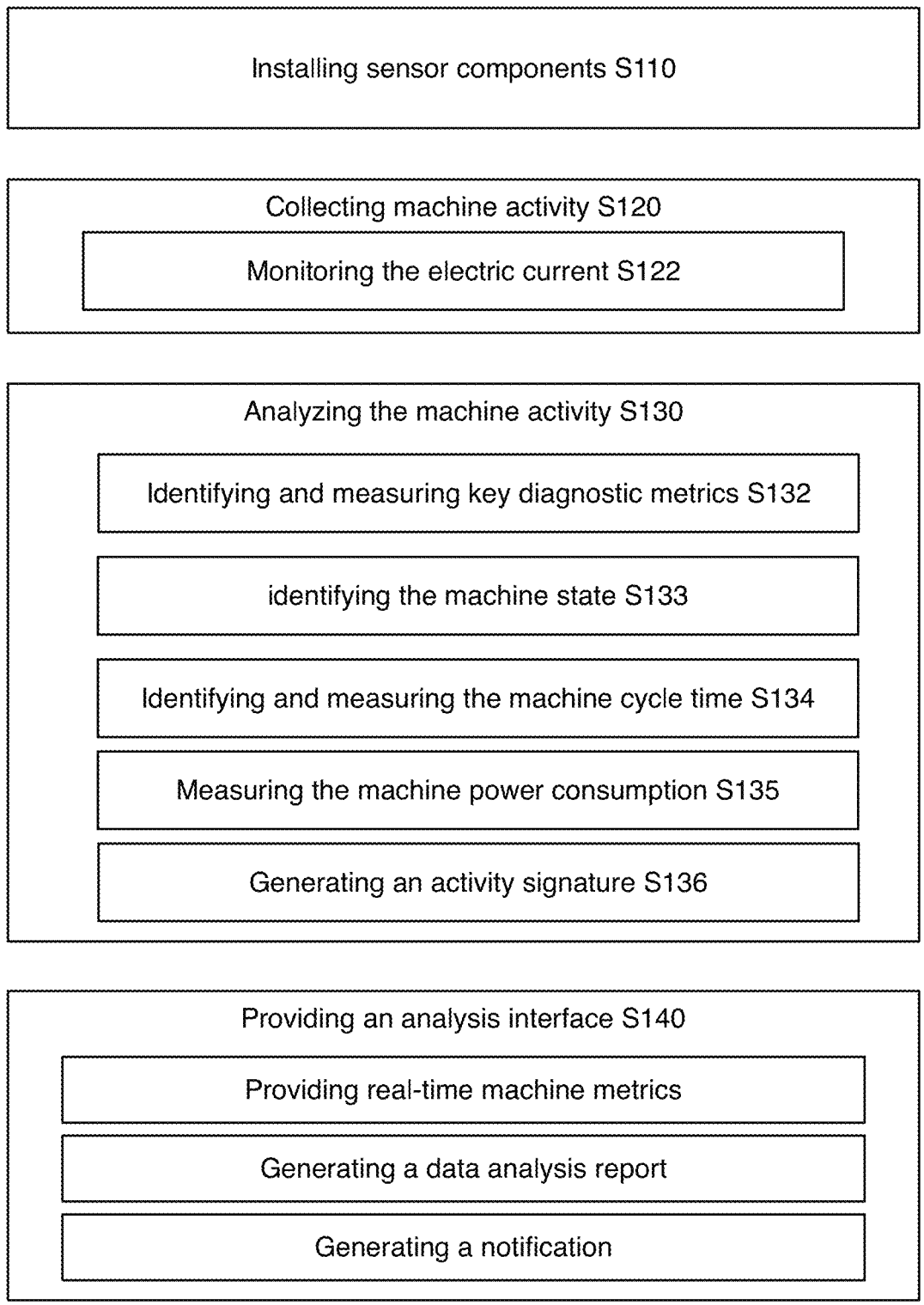
FIG. 4 is a flowchart representation of a method of a preferred embodiment.

As seen in FIG. 4, a method for monitoring manufacturing machines may include: installing sensor components S110 to monitor a plurality of machines, collecting machine activity S120, analyzing the machine activity S130, and providing an analysis interface S140 that may include the set of key diagnostic metrics and the analyzed data. The method preferably involves the monitoring of manufacturing machines using non-invasive sensing approaches. In this way the method can monitor a plurality of machines in a manufacturing environment without relying on particular features of a machine (e.g., not dependent on modern machine data features) and without needing complicated system installation.

As shown in FIG. 5, one preferred variation of the method preferably includes electrically coupling a set of electric current sensors to a set of power lines, wherein each power line is connected to one of a plurality of machines S111; collecting machine activity data from a set of sources associated with the plurality of machines S121, wherein the machine activity data includes electrical signals from the set of electric current sensors; for each source of machine activity data, selecting an analysis model S131 and analyzing the machine activity data S130, wherein analyzing the machine activity data comprises identifying at least one diagnostic metric from the electric signal; and providing an analysis interface S140 that exposes access to diagnostic metrics across at least a subset of the plurality of machines.

The method is preferably implemented by a system substantially similar to the one above but may alternatively be implemented by any suitable system.

Block S110, which includes preferably includes installing sensor components, functions to place, position, and otherwise configure sensors, and sensor components, such that the sensors are able to appropriately monitor a plurality of machines. An installation instance preferably has a plurality of machines. As described above the machines can be of any suitable combination of types of machines. Installing sensor components S110 may comprise of installing sensor components directly on the machines, within some proximity of the machines, within some central access point, or whatever location and/or position that would allow the sensors to function properly. In some preferred variations, wherein the sensors are used to monitor the electric currents of the plurality of machines, installing the sensor components S110 can include electrically coupling a set of electric current sensors to a set of power lines, wherein each power line is connected to one of a plurality of machines S111. The electric current sensors are preferably integrated at set of circuit breakers (or a circuit breaker panel) that is electrically connected to the plurality of machines.

In particular, a current transformer can be electrically coupled to a power line (e.g., a phase of a three-phase power line of a machine). Each monitored machine can have at least one current transformer coupled to a corresponding power line. Each current transformer is communicatively coupled to a local computing system that preferably includes a communication module such as was described in the system above. As one alternative, installing sensor components S110 may comprise of installing a control relay and measurement system between a power source and the plurality of machines.

Installing sensor components can additionally include configuring a set of sensors for a set of monitored machines, which functions to initialize the system for monitoring. Configuration preferably includes for at least a subset of sensors assigning machine attributes according to the sensor-machine pairing. Machine attributes such as machine type, model, use, location, and/or other information can be mapped or otherwise associated with a corresponding sensor. For example, an electric current sensor attached to the power line of a horizontal lathe will be configured within the management platform as being associated with the horizontal lathe. This may be used in labeling the collected data and resulting key diagnostics metrics. The pairing can additionally be used in selecting an analysis model corresponding to the machine pairing and appropriately applying one of a set of different analysis procedures. In some cases, a machine may be a custom machine or may not have type information entered in the management platform. In one variation, the method may include selecting a comparable machine for reference such that analysis procedures and models can be based on the similar machine. In another variation, a customized analysis model may be generated through usage and monitoring of the machine.

Block S120, collecting machine activity functions to monitor and gather machine activity from the plurality of machines. Machine activity data is preferably collected from a set of sources associated with the plurality of machines. Preferably, collecting machine activity S120 includes monitoring electric current S122 as a primary source of activity data. But collecting machine activity S120 may additionally include collecting supplementary activity data. The supplementary activity data may include any and/or all diagnostically useful information from the plurality of machines. Diagnostic useful information may include unintended diagnostic output information (machine heat generation, machine vibration, and machine sound). Diagnostic useful information may include purposefully outputted/available data such as a production schedule, machine operation data directly collected from a machine, g-code or operation instructions, machine operator input and labeling of machine operation and/or other sources of operation data. The supplementary machine activity may be used in combination with the electrical current. For example, a production schedule may be used in training for extracting a part label to detected part production signatures.

Block S122, which includes monitoring electric current, functions in obtaining machine operation data that may be further used to determine key diagnostic metrics for machine management and monitoring. The electric current can be collected by electrically coupling sensor components to at least one phase of a power source of a manufacturing machine. Monitoring electric current S122 can be preferably collected at a circuit breaker panel as described above. Alternatively, telemetric methods for monitoring the electric current S122 may be implemented.

Monitoring the electrical current S122 preferably involves processing the electric current into an electric signal. That is, monitoring the electric current S122 preferably includes generating a time series data set of samples of electrical current used in powering the machine, i.e., electric signal. In one variation, the electric current may be collected at a preconfigured sampling rate. In another variation, the method may include collecting segments of the electrical signal with varying resolution. A high-resolution sample can preferably be selectively collected. In one implementation, a high-resolution data sample can be collected periodically and relayed for performing a subset of analysis processes that rely on high data resolution. In another implementation, a high-resolution data sample can be dynamically collected in response to identifying some condition in the lower resolution electrical signal. Alternatively, a high-resolution data set may be continuously collected, and local processing used in compressing the data set or generating a subset of analysis processes local to the machine to avoid high bandwidth data communication to a machine analysis platform.

Collecting machine activity S120 may further include relaying the collected data for further analysis. That is Block S120 may include relaying the processed electric to a communication module that acts as a gateway to an analysis engine.

Block S130, analyzing machine activity functions to translate the collected machine activity data to an interpretation of one or more machine metrics. Analyzing machine activity S130 may comprise of multiple approaches in interpreting machine metrics. Analyzing machine activity may implement forms of machine learning, heuristic-based analysis, statistical analysis, forms of signal processing, human aided learning, and/or other approaches to interpreting the machine activity. Analyzing machine activity S130 may apply the same and/or different forms of analysis on a single machine and/or distinct machines. In the preferred implementation of the method wherein a plurality of machines are monitored; analyzing machine activity S130 may comprise of similar techniques implemented across multiple machines performing the same type of task, across a part of the manufacturing process (e.g., analysis of a single object part as it moves from machine to machine), across the entire manufacturing plant, or any suitable segment of operation or factory process. Analyzing machine activity S130 may include tracking utilization, tracking unit production, tracking machine/tooling status, and/or other suitable analysis processes. In a method of preferred embodiment, analyzing machine activity S130 includes identifying and measuring key diagnostic metrics S132 and/or generating an activity signature S136.

In one variation, analyzing machine activity S130 may include selecting an analysis model. An analysis model here can include one or more analysis processing routines or algorithms, a set of machine learning models used in machine learning processing, reference data, rules, and/or other constructs that can facilitate analysis of the data. The selection of an analysis model is preferably performed for each source of machine activity data. In the variation where just electric signals are collected, each for one machine, then an analysis model can be selected for each electric signal. In the variation where there are supplemental forms of activity data then an analysis model may additionally be assigned to each other source of activity data so it can be appropriately analyzed.

The selected analysis process for a given machine may be based on machine type, but may alternatively or additionally use model, class, configuration, and/or other information related to the machine. In another variation, selection of analysis model may be automatically generated based on usage. Different models may exist for different classes of machines (e.g., CNC, band saw, lathe, etc.), models of machines (e.g., CNC model number XP3000, CNC model number NT1200, etc.), or another machine feature. Selection of an analysis model may similarly select an appropriate analysis model. If a model does not exist, then the method may support training of machine signal analysis. In one variation this may leverage human assisted label of electrical power signals and other aspects.

Selection of a machine type maybe performed automatically through analysis of the activity data. Automatic selection of an analysis model preferably uses automatic classification of machine properties (e.g., type, model, use, etc.). A variation with automatic selection of an analysis model may include detecting an electric signal activity signature and matching the electric signal activity signal to one or more machine properties. The operation of a machine and its corresponding power usage patterns will preferably have particular attributes indicative of various machine properties. In some cases, the activity signature may be associated with the machine type.

Block S132, identifying and measuring key diagnostic metrics, is preferably a component of analyzing machine activity S130. Identifying and measuring key diagnostic metrics S132 functions in processing the electric signal to extract and measure metrics to monitor the system. Identifying and measuring key diagnostic metrics preferably includes identifying the machine state S133, identifying and measuring the machine cycle time S134, and/or measuring the machine power consumption S135. Alternatively other key diagnostic metrics may be implemented or added.

Block S133, which includes identifying the machine state, functions in tracking machine utilization and detecting activity status of the machine. Utilization is preferably measured as a temporal metric such as total amount of time in some state, timing of a state, and the like. Preferably, identifying the machine state can include tracking: active usage, (on, and actively being used for a manufacturing process), idle usage (on, but not fully engaged in a manufacturing process), and inactive (off). In other words, identifying or otherwise classifying machine state preferably includes identifying a segment of an electric signal as being in a machine state selected from a set of machine states that includes at least an on-state, and off-state, and an idle-state. Other states could similarly be identified. A machine state model is preferably created or provided that can be used in a machine learning process to assign a classifier to a sample of activity data. The machine state model may be selected based on machine type. Alternatively, a default machine state model may be used for unidentified machines or custom machines. The machine state model can additionally be updated through use of the system. For example, the electric current signal of a particular type of machine will exhibit different signal properties depending on if it is in an on-state, an off-state, or an idle-state. Configuration of the machine type for a particular electric current signal can be individually classified according to type or selected analysis model. Different machines may have different activity status classifications that may be specific to their operation. For example, some machines may have a warming up state, a calibrating state, a cool down state, a cleaning state, low activity state, medium activity state, heavy activity state, and/or any other classifications of activity state. Different activity states can preferably be identified by analyzing the electric signal.

Block S134, which includes measuring the machine cycle time, functions to detect and generate metrics for the production of a particular part and/or process, i.e., cycle. Measuring a cycle time preferably includes detecting a machine cycle in the electric signal and measuring the time of the machine cycle. Detecting a machine cycle is preferably performed through segmenting the electric signal. In many manufacturing processes, a machine will be repeatedly used for the same process. For example, a CNC machine will repeatedly perform the same sequence of cuts to a material. Those series of cuts may be considered a cycle for that particular CNC machine (and other CNC machines performing the same operation). Measuring the machine cycle time for this particular example may then include measuring the time it would take for the CNC machine to perform the series of cuts to the material. In addition to the actual cycle time, measuring the machine cycle time identifies the operating machine (CNC machine in this example), and identifies the operation (the specific series of cuts) that the operating machine is performing. To summarize, in the general case, measuring the machine cycle time may include: identifying the machine, identifying the operation (cycle), and measuring the time taken to perform the entire cycle. As certain machines may perform multiple tasks and/or build multiple things, a machine may have multiple distinct cycles, wherein measuring the machine cycle time will preferably identify and measure each one of them as they occur and as desired.

A cycle may be redefined to take into account a smaller or larger scale of operation and observation. In some variations a subset of a previously identified cycle may be considered a cycle. Considering again the CNC machine cutting example, a cycle may be redefined such that each cut is a cycle, and thereby measuring the cycle time would measure the time for each cut, instead of the entire series of cuts. In another variation, a superset of a series of identified cycles may be redefined as a new cycle. Measuring a machine cycle accordingly may include segmenting machine utilization into cycle segments and automatically identifying a hierarchy of cycle segment grouping. This can be used to detect cycle segment patterns and organization of machine activity. For example, producing a single object may comprise of a series of operations performed by a series of machines. In this example, the cycle may be redefined as a superset of all the operations required to produce the single object. A single machine may have multiple cycle times wherein measuring the machine cycle time may measure some and/or all of the cycle times simultaneously or at different times according to when the cycles are occurring. Redefining the cycle may occur autonomously through machine learning, through a derived regression, or through other type of decision making, prediction tools, and/or automated process. Alternatively, the cycle may be redefined by a human user.

Block S135, which includes measuring the machine power consumption, functions to measure the power usage by a machine. Measuring the machine power consumption may comprise of a time series rate of energy consumption per second. Measuring the machine power consumption is preferably performed concurrently with the measuring of all other key diagnostic metrics.

As an additional variation, measuring a key diagnostic metric can include detecting machine maintenance state, which functions to identify anomalies or patterns in the electric signal indicative of a particular issue or as a metric of some machine issue. In one implementation, detecting machine maintenance state can include detecting harmonic frequencies in the electric current signal. Particular harmonic frequencies and/or other signal patterns can be indicative of maintenance issues such as with unbalanced motors and/or tooling wear. In one implementation, a Fourier analysis of the electric current signal may identify particular harmonic frequencies that correspond to a particular machine maintenance state when satisfying particular properties (e.g., magnitude, duration of observation, etc.). In one variation, detection of a maintenance state can detect discrete states (e.g., "needs calibration", "calibrated"). In another variation, the maintenance state can be a measure such that it can be tracked before it's an issue and used to make predictions or report on maintenance timelines.

Block S136, which includes generating an activity signature, functions to connect an operation (or operations) of a plurality of machines with an electric signal. Generating an activity signature S136 comprises of determining a specific electric signal profile that correspond to an implementation of a distinct set of machines, machine states, cycles, and cycle times. The activity signature may additionally or alternatively correspond to other properties of the system and method. Generating an activity signature S136 may follow identifying and measuring key diagnostic metrics S132 from and electric signal. The activity signature may characterize various patterns or properties of the electric signal of a machine during usage and can be used in identifying other times of use with the same or similar signature. For a plurality of machines, generating an activity signature S136 may be used to identify: the current number of operating machines, the type(s) of operating machines, the machine state(s), current operations(s) being performed, estimated cycle time(s), and the estimated power consumption. Generating an activity signature may aid in identifying other machine related properties.

Detecting errors using the activity signature may be an additional a component of generating an activity signature. Detecting errors functions in detecting manufacturing flaws, identifying machine failures, and predicting machine failures. Detecting errors identifies electric signal abnormalities by comparing an electric signal for a known operation with a previously generated activity signature for the same operation. Through implementation of machine learning, heuristic-based learning, statistical analysis, and human-aided learning, identifying electric signal abnormalities may be connected with manufacturing flaws and flaw detection. This method may additionally be used in identifying portions of the production process that cause more wear on the machine, are less efficient, or have other impacts on machine operation. Detecting errors may include predicting maintenance needs of a machine. In some cases, the maintenance may relate to machine calibration, routine maintenance of the machine, or for replacement of a tool used by the machine. A new tool will generally result in improved performance. As the tool degrades energy usage may increase, imbalances may be introduced which can be detected by identifying electric signal abnormalities as the electric signal slowly diverges from the activity signature.

In a similar manner to detecting errors, generating an activity signature S136 may further include predicting operating properties. Generating activity signature S136 may allow predicting output times, production costs, machine longevity, recommended machine maintenance times, operational bottlenecks, inventory count, and/or other metrics of interest that may be learned from the system. Additionally, generating an activity signature S136 may allow predicting hypothetical operation properties such as changes induced by adding or removing a specific a machine from the system. For the cutting example, generating the activity signature may allow predicting an estimated power consumption and total unit output with the addition of a new CNC machine.

Block S140, providing an analysis interface, functions to take an action in response to the extracted machine metrics and analyses. Providing an analysis interface S140 is preferably applied to enable an operator or manager to better understand and operate their machines. Providing an analysis interface preferably exposes access to diagnostic metrics across at least a subset of the plurality of machines. That access may be through a user interface, an interaction, and/or communication. Providing an analysis interface S140 is preferably facilitated through some form of a management platform as described above. In one implementation, providing an analysis interface S140 can include providing real-time machine metrics, generating a data analysis report, and/or generating a notification.

Providing real-time machine metrics is preferably a component of providing an analysis interface S140. Providing real-time machine metrics preferably includes exposing some interface to the current status of the machines. A management dashboard can preferably be used in providing a graphical interface representing the current machine status. An application programming interface or other type of interface may alternatively be used. Through the interface a user may choose and/or adjust the displayed real-time metrics, thereby changing what is shown by providing real-time metrics.

Generating a data analysis report is preferably a component of providing an analysis interface S140. Generating a data analysis report can preferably be a summary of the status of the plurality of machines over a time period of interest or over multiple time periods of interest. The status report may include all operations that the plurality of machines has performed (including products created). In one variation, generating a data analysis report can be interactive such that a user could perform queries and filters on the associated data. In another variation, the data analysis report can be a static report that may be digitally communicated or presented. Generating a data analysis report may further generate predictions about the system and method through these queries.

Generating a notification can be used in triggering some event. In general, a notification can be a message delivered to some user. Notifications are preferably used in alerting operators or managers of some special condition. For example, if an anomaly is detected in the operation of a machine, then an operator could be notified. The notification could be an application notification, an SMS message, a phone call, an email, an alarm, or any suitable form of notification. A rule engine could additionally be used in setting custom rules for notifications. In one variation, machine maintenance recommendations may be generated based on the various metrics (e.g., amount of utilization since last maintenance check, machine/tool degradation detection, etc.). Additionally, operating recommendations could be generated and delivered through some interface. For example, various parts of a part manufacturing process could be highlighted as needing attention or possible opportunities for improvement.

In one variation, the method can additionally incorporate analytic reporting by part, process, client, or other suitable contextual information. In one variation, the method can include collecting operator input (e.g., from a machine management device), which may be used in assigning this metadata around machine usage. In one variation, the method can include receiving machine operation labels from an operator-controlled machine management device. Through this, providing an analysis interface further may include organizing diagnostic metrics by machine operation labels such as part number, project identifier, client, and the like. In another variation, the method can include automatic or semi-automatic part identification through the activity data. In this variation, analyzing machine activity data comprises creating a part signature from the activity data (e.g., electric signal) and assigning a part identifier. This may be similar to or part of creating cycle signatures. A part signature may not be limited to a single usage cycle however. A part identifier may be an internal label, which may be later assigned a user-interpretable name. In this variation, analyzing machine activity data could comprise organizing diagnostic metrics by part identifier.

The systems and methods of the embodiments can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor, but any suitable dedicated hardware device can (alternatively or additionally) execute the instructions. As a person skilled in the art will recognize from the previous detailed description and from the figures and claims, modifications and changes can be made to the embodiments of the invention without departing from the scope of this invention as defined in the following claims.

We claim:

1. A system for monitoring manufacturing status for manufacturing machines comprising:
   a sensor system that monitors electrical signals from a plurality of manufacturing machines, wherein the sensor system comprises a set of current transformers, wherein each current transformer of the set of current transformers couples to a power line connected to a corresponding manufacturing machine, and wherein each current transformer transforms electric currents of the power line into an electrical signal of the corresponding manufacturing machine;
   an activity processing engine, wherein the activity processing engine generates manufacturing diagnostic metrics from the electrical signal for each manufacturing machine and assign a part identifier based on the classification by the trained machine learning model to a subset of the machine cycles, wherein the subset of the machine cycles assigned to the part identifier are detectable in the electrical signals of different manufacturing machines when manufacturing a similar part; and
   a management platform configured to provide access to the manufacturing diagnostic metrics of the plurality of manufacturing machines, the management platform comprising at least one user interface configured to express the manufacturing diagnostic metrics of the plurality of manufacturing machines organized by part identifiers.

2. The system of claim 1, wherein the plurality of manufacturing machines comprises subsets of manufacturing machines of distinct types of machines and distinct models, wherein at least one manufacturing machine of the plurality of manufacturing machines does not have data reporting capabilities.

3. The system of claim 1, wherein the machine cycles include, in addition to machine cycles assigned to the part identifiers, machine cycles associated with a set of states that includes at least: an on-state, an off-state, and an idle-state; wherein the activity processing engine additionally comprises configuration to train the trained machine learning model to classify the machine cycles associated with the set of states across similar types of manufacturing machines.

4. The system of claim 1, wherein the manufacturing diagnostic metrics comprise machine cycle time.

5. The system of claim 1, wherein the at least one user interface configured to express the manufacturing diagnostic metrics of the plurality of manufacturing machines organized by the part identifiers is further configured to express a unit production count associated with a number of machine cycles assigned to the part identifier.

6. The system of claim 1, wherein the sensor system further comprises a breaker box unit that communicatively couples with at least a subset of the set of current transformers; wherein each current transformer of the set of current transformers electrically couples to power lines of a connected machine at a breaker box; and a communication module communicatively couples to the breaker box unit, wherein the communication module is configured to communicate the electrical signals to the activity processing engine.

7. The system of claim 1, wherein the activity processing engine further comprises configuration to: perform Fourier analysis of the electrical signals, and for at least one electrical signal, detecting patterns of harmonic frequencies in the Fourier analysis of the at least one electrical signal that is indicative of cyclical signal variations corresponding to a machine maintenance state; and wherein the management platform is further configured to output an alert associated with the machine maintenance state.

8. The system of claim 7 wherein the alert is a tool degradation alert.

9. The system of claim 7, wherein the alert is a machine calibration alert.

10. The system of claim 1, further comprising a machine management device located at a manufacturing machine, the machine management device including a second user interface configured to receive contextual data on operation of the manufacturing machine including a part label, wherein the contextual data is used in assigning the part identifier to a classified machine cycle of the manufacturing machine.

11. The system of claim 1, wherein production operation of the plurality of manufacturing machines is planned from the manufacturing diagnostic metrics.

12. The method of claim 1, further comprising, comparing a first electrical signal of a first machine cycle to a previous electrical signal of the first machine cycle, identifying electrical signal abnormalities, and detecting potential manufacturing issues based on the electrical signal abnormalities, and wherein outputting the manufacturing diagnostic metrics comprises generating an alert for potential manufacturing issues.

13. A method for monitoring manufacturing status for manufacturing machines comprising:
    electrically coupling a set of electric current sensors to a set of power lines, wherein each power line is connected to one of a plurality of manufacturing machines;

collecting, using the set of electric current sensors, electric signals for each manufacturing machine from the plurality of manufacturing machines;

generating manufacturing diagnostic metrics from the electric signals for each manufacturing machine from the plurality of manufacturing machines, wherein the generating comprises, for each electric signal of the electric signals:

classifying, using a machine learning model, a machine cycle through detection of machine cycle signature features in the electric signal, the machine cycle selected from a set of machine cycles that includes at least a subset of the machine cycles associated with part identifiers, wherein the subset of machine cycles associated with the part identifiers are detectable in the electric signals of a different manufacturing machine when manufacturing a similar part, and assigning a part identifier based on the classification by the machine learning model to the machine cycle; and outputting, at a user interface of a management platform, the manufacturing diagnostic metrics of the plurality of manufacturing machines organized by the part identifiers.

14. The method of claim 13, wherein the plurality of manufacturing machines comprises subsets of manufacturing machines of different types of machines and distinct models, wherein at least one manufacturing machine of the plurality of manufacturing machines does not have data reporting capabilities.

15. The method of claim 13, wherein generating the manufacturing diagnostic metrics from the electric signals comprises identifying a segment of the electric signal as being in a machine state selected from a set of machine states that includes at least: an on-state, an off-state, and an idle-state.

16. The method of claim 13, further comprising, for each electric signal of the electric signals, measuring a time of the machine cycle; and wherein outputting the manufacturing diagnostic metrics of the plurality of manufacturing machines organized by the part identifiers includes a cycle time associated with the part identifier based on the time of the machine cycle.

17. The method of claim 13, further comprising, for each electric signal of the electric signals, measuring a machine power consumption associated with the machine cycle; and wherein outputting the manufacturing diagnostic metrics of the plurality of manufacturing machines organized by the part identifiers includes the machine power consumption associated with the part identifier.

18. The method of claim 13, further comprising receiving machine operation labels from an operator-controlled machine management device; wherein the machine operation labels are used in assigning the part identifier to the machine cycle.

19. The method of claim 13, wherein generating the manufacturing diagnostic metrics from the electric signals further comprises for each electric signal:

classifying each electric signal by machine type;

selecting an analysis model for each electric signal, wherein the analysis model is selected according to the machine type; and analyzing each electric signal according to the selected analysis model.

20. The method of claim 19, wherein classifying each electric signal by the machine type is performed automatically through analysis of the activity data.

\* \* \* \* \*